(12) United States Patent
Steinbrink et al.

(10) Patent No.: US 10,330,695 B2
(45) Date of Patent: Jun. 25, 2019

(54) SENSOR UNIT FOR A VEHICLE, AND METHOD FOR PRODUCING A SENSOR UNIT FOR A VEHICLE

(71) Applicant: Robert Bosch GmbH, Stuttgart (DE)

(72) Inventors: Ronald Steinbrink, Hoerselberg-Hainich (DE); Stefan Ortmann, Walterhausen (DE); Conrad Haeussermann, Trochtelfingen (DE); Anwar Hegazi, Frienstedt (DE); Andreas Fink, Würzburg (DE); Bernd Lutz, Kempten (DE); Mirko Scheer, Besigheim (DE)

(73) Assignee: Robert Bosch GmbH, Stuttgart (DE)

( * ) Notice: Subject to any disclaimer, the term of this patent is extended or adjusted under 35 U.S.C. 154(b) by 110 days.

(21) Appl. No.: 15/116,937

(22) PCT Filed: Dec. 4, 2014

(86) PCT No.: PCT/EP2014/076497
§ 371 (c)(1),
(2) Date: Aug. 5, 2016

(87) PCT Pub. No.: WO2015/117693
PCT Pub. Date: Aug. 13, 2015

(65) Prior Publication Data
US 2017/0176486 A1    Jun. 22, 2017

(30) Foreign Application Priority Data
Feb. 6, 2014    (DE) .................. 10 2014 202 192

(51) Int. Cl.
*G01P 1/02*    (2006.01)
*G01D 11/24*    (2006.01)
*H01L 23/50*    (2006.01)

(52) U.S. Cl.
CPC ............ *G01P 1/026* (2013.01); *G01D 11/245* (2013.01); *G01P 1/02* (2013.01); *H01L 23/50* (2013.01)

(58) Field of Classification Search
CPC ........ G01D 11/245; G01P 1/026; H01L 23/50
See application file for complete search history.

(56) References Cited

U.S. PATENT DOCUMENTS 6,035,712 A * 3/2000 Ohta .................. G01P 1/023
                                                    73/493

FOREIGN PATENT DOCUMENTS

CN          101147045 A      3/2008
DE    10 2005 012 709 A1    9/2006
(Continued)

OTHER PUBLICATIONS

International Search Report corresponding to PCT Application No. PCT/EP2014/076497, dated Mar. 12, 2015 (German and English language document) (7 pages).

*Primary Examiner* — Paul M. West
(74) *Attorney, Agent, or Firm* — Maginot, Moore & Beck LLP

(57) ABSTRACT

A sensor unit for a vehicle includes a sensor circuit, a main part that supports the sensor circuit with at least one sensor contact, a connection cable, and a pot-shaped sleeve. The main part includes a sensor contact, a cable contact, and common contact support. The sensor contact is positioned on a first end of the contact support, and the cable contact is positioned on a second end of the contact support. The sensor contact is electrically connected to the at least one sensor contact via at least one sensor counter contact, and the cable contact is electrically connected to the connection cable via at least one cable contact. The sensor circuit is arranged on an end region of the contact support such that the sensor circuit is oriented in a predetermined detection (Continued)

direction. The detection direction is based on a bending angle of the end region relative to a longitudinal axis of the main part. The pot-shaped sleeve is fixed to the main part, and surrounds the sensor contact and the sensor circuit. The shape of the sleeve is adapted to the detection direction of the sensor circuit.

20 Claims, 6 Drawing Sheets

(56) References Cited

FOREIGN PATENT DOCUMENTS

| | | |
|---|---|---|
| DE | 10 2006 029 980 A1 | 1/2008 |
| DE | 10 2007 036 264 A1 | 2/2009 |
| DE | 10 2009 028 963 A1 | 3/2011 |
| DE | 10 2009 046 439 A1 | 5/2011 |
| EP | 1 619 507 A2 | 1/2006 |
| EP | 2 653 839 A1 | 10/2013 |
| JP | 8-128379 A | 5/1996 |
| JP | 2001-41778 A | 2/2001 |
| JP | 2008-533494 A | 8/2008 |
| WO | 2006/100143 A1 | 9/2006 |

* cited by examiner

SENSOR UNIT FOR A VEHICLE, AND METHOD FOR PRODUCING A SENSOR UNIT FOR A VEHICLE

This application is a 35 U.S.C. § 371 National Stage Application of PCT/EP2014/076497, filed on Dec. 4, 2014, which claims the benefit of priority to Serial No. DE 10 2014 202 192.8, filed on Feb. 6, 2014 in Germany, the disclosures of which are incorporated herein by reference in their entirety.

BACKGROUND

The disclosure relates to a sensor unit for a vehicle and to a method for producing a sensor unit for a vehicle.

Present-day rotational speed sensors are constructed by means of connecting in an electrical manner an ASIC package that is based on a leadframe to a two-core connection cable. The customer-specific application in the vehicle and also the insulation of the electrical components are generally achieved in a simple or modular form by means of an injection molding process using a thermoplastic or duroplastic material. The connection cable and components for application in the vehicle and plug connector are manufactured on separate production lines. As a result of this manufacturing procedure, it is consequently generally necessary to provide a production line for manufacturing the leads and a costly production line for manufacturing the sensor and also to provide transportation concepts between the two production lines.

In the case of the injection molding process, the ASIC package or the sensor circuit is generally fixed by means of a retaining unit. The sealing arrangement between the retaining unit and the injection molding is provided by means of ribs that have small dimensions and fuse on as a result of the temperature during an injecting process and thus ensure a particular shape and a material closure. The sealing arrangement between the connection cable and the injection molding is performed by means of a mixture formed by activating the interfacial adhesive layers (slightly fusing on) and shrinking on the injection molding during the cooling process. The electrical connection between the leadframes of the ASIC package and the connection cable is usually performed by means of laser soldering, crimping with the aid of a terminal or by crimp connections and also direct welding the individual leads of the connection cable to the leadframe. The present-day construction is encumbered by considerable disadvantages of long cycle times caused as a result of the heavy shot weight of the synthetic material (cooling down times) and also the great variety of retaining and injection molding tools that are necessary for the different vehicle applications. Furthermore, depending upon the customer's application or the installation requirements of the sensor unit in the vehicle, the thermoplastic injection molding of the sensor circuit in different dimensions requires in the case of every new variant a substantial approval expenditure for the design and approval process since the thermal and mechanical stresses in the case of the injection molding process on the sensor circuit are to be avoided.

DE 10 2005 012 709 A1 discloses by way of example a magnetic field sensor, in particular a rotational speed sensor and/or direction of rotation sensor for a vehicle wheel or for the drive train of a vehicle. The magnetic field sensor comprises a retaining element for a sensor element and where necessary for further sensor components. The retaining element is embodied as an injection molding and comprises a pocket-like recess in the region of its read-side end face in which the sensor element is supported during the subsequent injection molding process with synthetic material at least in the direction of the injection pressure and thus is protected against mechanical damage. A connection arrangement for the described magnetic field sensor comprises a connection element that comprises two connection pieces in a first contact-making region and said connection pieces are connected respectively by way of a crimp connection in an electrical and mechanical manner to the connection cable ends that have been stripped of insulation. In a second contact-making region, the connection pieces can be connected in an electrical and mechanical manner to connection leads of a sensor element. The connection element is encased at least in part by a synthetic material injection molding that comprises a window-shaped cutout in a transition region between the first contact-making region and the second contact-making region, said window-shaped cutout being sealed during the process of injection molding the synthetic material injection molding in the injection molding tool. These connection pieces are initially embodied in one piece so as to facilitate the positioning of the connection element prior to the injection molding process and said connection pieces are subsequently electrically insulated with respect to one another by means of separating the connecting parts.

DE 10 2006 029 980 A1 discloses an exemplary sensor arrangement, in particular a sensor arrangement for sensing the rotational speed and/or direction of rotation for a vehicle wheel or for the drive train of a vehicle. The sensor arrangement comprises a retaining element, at least one sensor element, which is arranged on the retaining element and comprises a connector, wherein the connector is connected in an electrical manner at at least one connecting site by way of corresponding connecting means to at least one lead of a connection cable. The ends of the connection cable that have been stripped of insulation can be connected by way of example in each case by means of a crimp connection in an electrical manner to the connecting means. The end of the at least one lead of the connection cable is embedded with the connecting means at least in part in the retaining element so that a preform is produced, wherein the at least one connecting site is recessed for connecting to the sensor element. After contact has been made with the sensor element, the retaining element together with the sensor element can be injection molded with a synthetic material sheath.

SUMMARY

The sensor unit in accordance with the disclosure for a vehicle and the method in accordance with the disclosure for producing a sensor unit for a vehicle have in contrast the advantage that a new process chain is possible which renders it possible to keep the procedure of connecting the connection cable separate from the procedure of making electrical contact with the sensor circuit until the final application of the customer. As a consequence, it is possible to move the significant synthetic material injection molding process that is preferably a thermoplastic injection molding process to the lead side or to the lead production line and said significant synthetic injection molding process can be used in the form of a standard interface irrespective of the type of application or rather customer application. The electrical connection between the connection cable and the sensor circuit that is preferably embodied as an ASIC (Application-Specific Integrated Circuit) is performed on a production line that is considerably reduced with respect to the number and complexity by way of a mechanical joining and/or contact-making process. The customer-specific attachment of the application unit that is required for the connection to the vehicle is performed by means of an adaptable connection concept that renders possible a further modularity of the sensor unit.

Embodiments of the present disclosure render it possible in an advantageous manner by means of reducing the synthetic material shot weight to achieve short cycle times for the injection molding processes and to increase the level of automation on the sensor side by means of the assembly procedure of the sheath. Since it is no longer necessary to injection mold the sensor circuit or the ASIC, it is possible for the process window to be larger. In addition, a high level of standardization and as a consequence a lower number of tools can be achieved. Furthermore, it is possible in the lead production to introduce a cable module at the connection cable periphery having a synthetic material sheath so as to connect to a contact-making unit. As a consequence, the identical conditions always arise during the injection molding process and the process of sealing the connection cable and the contact-making unit. In addition, it is possible during the procedure of producing the leads to achieve a customer-specific variance of the applications in the form of geometric requirements and/or additional requirements such as by way of example sealing functions or attaching functions in a simple manner by means of mountable or directly injected attachment modules that do not have any influence on internal components. In addition, it is possible to achieve different ASIC packages, such as by way of example BGA (Ball Grid Array), during the procedure of producing a pre-assembled sensor module that comprises the sensor circuit and the sheath as a sensor housing. The standardized cable-contacting arrangement at the contact-making module renders it possible for the production of the customer-specific or vehicle-specific variants to be moved to the lead production line and this renders possible a simple assembly process and final finishing of the sensor unit at the same time as being able to handle the cable in a simple manner. In an advantageous manner, the cable module and/or the contact-making module and/or the attachment module and/or the sensor module are embodied as pre-assembled modules that can be produced separately from one another.

Embodiments of the present disclosure provide a sensor unit for a vehicle, said sensor unit having a base body that supports a sensor circuit having at least one sensor contact and said base body comprising at a first end a sensor-contacting arrangement that is connected in an electrical manner by way of at least one sensor mating contact to the at least one sensor contact, and said base body comprising at a second end a cable-contacting arrangement that is connected in an electrical manner by way of at least one cable contact to a connection cable. The sensor-contacting arrangement and the cable-contacting arrangement are arranged on a common contact carrier. In accordance with the disclosure, the sensor circuit is arranged at an end region of the contact carrier in such a manner that the sensor circuit is oriented in a desired sensing direction. The sensing direction is predetermined by means of a bend angle of the end region of the contact carrier with respect to the longitudinal axis of the base body. In addition, the sensor-contacting arrangement having the sensor circuit is encased by a pot-shaped sheath that is fixed to the base body and the shape of said pot-shaped sheath is tailored to suit the sensing direction of the sensor circuit.

In addition, a method for producing such a sensor unit is proposed, wherein the sensor circuit is arranged at an end region of the contact carrier and oriented in a desired sensing direction. The sensing direction is predetermined by means of bending the end region of the contact carrier about a bend angle with respect to the longitudinal axis of the base body, wherein a sheath is fixed to the base body, said sheath encasing the sensor-contacting arrangement having the sensor circuit. The shape of the sheath is tailored to suit the sensing direction of the sensor circuit.

The further developments and features disclosed in the claims, description, and drawings render possible advantageous improvements to the sensor unit, said developments and features also providing improvements to the method for producing a sensor unit for a vehicle.

It is particularly advantageous that a first sensing direction of a first sensor circuit can extend in an axial manner with respect to the longitudinal axis of the base body so that a first bend angle of the end region of a first contact carrier can have a value in the range between 80° and 90° with respect to the longitudinal axis of the base body and a first sheath can be embodied as a pot cylinder wherein the first sensor circuit abuts against the end face of said pot cylinder. As an alternative, a second sensing direction of a second sensor circuit can extend in a perpendicular manner with respect to the longitudinal axis of the base body so that a second bend angle of the end region of a second contact carrier can have a value in the range of 0° to 30° with respect to the longitudinal axis of the base body and a second sheath can be embodied as a pot cylinder that comprises an end face, a first inclined surface and a flattened area wherein the second sensor circuit abuts against said flattened area. As a further alternative, a third sensing direction of a third sensor circuit can extend at a predetermined angle in an inclined manner with respect to the longitudinal axis of the base body so that a third bend angle of the end region of a third contact carrier can have a value in the range of 40° to 60° with respect to the longitudinal axis of the base body and a third sheath can be embodied as a pot cylinder that comprises a first inclined surface, a second inclined surface and a third inclined surface, wherein the third sensor circuit abuts against said third inclined surface.

In an advantageous embodiment of the sensor unit in accordance with the disclosure, a seal can seal the sheath with respect to the base body. The seal can be embodied preferably as an O-ring seal that is placed in a corresponding receiving groove in the base body.

In a further advantageous embodiment of the sensor unit in accordance with the disclosure, the base body and the contact carrier form a contact-making module, wherein the base body can be embodied as a synthetic material injection-molded part that encases the contact carrier at least in part. The base body that is embodied as a synthetic material injection-molded part can omit the contact carrier at least at the cable-contacting arrangement and/or the sensor-contacting arrangement so as to facilitate the cable-contacting arrangement or the sensor-contacting arrangement.

The electrical cable-contacting arrangement between the connection cable and the at least one cable contact can be embodied by way of example as a mechanical connection, preferably as a crimp connection and/or an insulation displacement connection. So as to form a cable module, an end region of the base body, which comprises the cable-contacting arrangement, and an end region of the connection cable can be injection molded in a fluid-tight manner after making contact with the connection cable. The cable module can guide the connection cable in dependence upon the customer application and the installation conditions in the vehicle in an axial manner or at a predetermined angle with respect to the base body.

In a further advantageous embodiment of the sensor unit in accordance with the disclosure, a base body of an attachment module can be embodied as a synthetic material injection-molded part that can be injection molded or pushed onto the cable-side end of the base body. The attachment module can comprise an attachment bracket that is formed as one on the base body and comprises an attachment eyelet. In addition, the cable module can be integrated into the attachment module. This means that the synthetic material sheath of the cable module and the base body of the attachment module can be formed in a common injection molding process.

In an advantageous embodiment of the method in accordance with the disclosure, the bend angle for the end region of the contact carrier can be set in dependence upon the sensing direction of the sensor circuit being used. The shape of the sheath can also be selected in dependence upon the sensing direction of the sensor circuit being used.

In a further advantageous embodiment of the method in accordance with the disclosure, the base body can be embodied as a synthetic material injection-molded part that is injection molded around the contact carrier, wherein a recess is formed in the base body at least at the cable-contacting arrangement and/or the sensor-contacting arrangement.

In a further advantageous embodiment of the method in accordance with the disclosure, the base body having the sensor circuit and the sheath can be embodied as a pre-assembled sensor module that can be connected to a cable module and/or an attachment module.

In a further advantageous embodiment of the method in accordance with the disclosure, the electrical cable-contacting arrangement can be embodied as a mechanical connection, preferably as a crimp connection and/or an insulation displacement connection between the connection cable and the at least one cable contact. An end region of the base body, which comprises the cable-contacting arrangement, and an end region of the connection cable can be injection molded in a fluid-tight manner so as to form a cable module.

In a further advantageous embodiment of the method in accordance with the disclosure, a base body of an attachment module can be embodied as a synthetic material injection-molded part that is injection molded or pushed onto a cable-side end of the base body. The attachment module can comprise an attachment bracket that is formed as one on the base body and comprises an attachment eyelet.

Exemplary embodiments of the disclosure are illustrated in the drawings and further explained in the description hereinunder. In the drawings, like reference numerals refer to components or elements that have like or similar functions.

DETAILED DESCRIPTION

Figure 1:
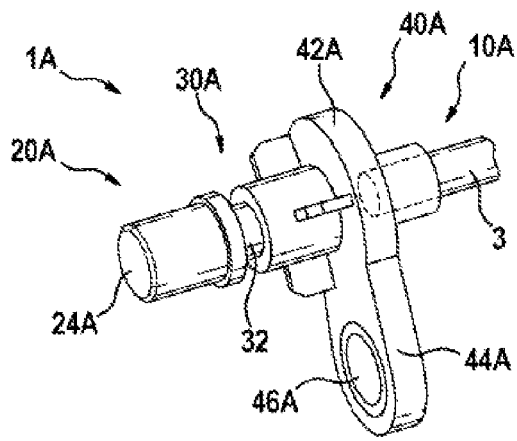
FIG. 1 illustrates a schematic perspective view of a first embodiment of a sensor unit in accordance with the disclosure for a vehicle.

As is evident in FIGS. 1 to 17, the illustrated exemplary embodiments of a sensor unit in accordance with the disclosure 1A, 1B for a vehicle comprise in each case a base body 32 that supports a sensor circuit 22A, 22B, 22C having at least one sensor contact 26.1A, 26.1B, 26.1C, 26.2A, 26.2B, 26.2C, and said base body comprising at a first end a sensor-contacting arrangement 38A, 38B, 38C that is connected in an electrical manner by way of at least one sensor mating contact 38.1A, 38.1B, 38.1C, 38.2A, 38.2B, 38.2C to the at least one sensor contact 26.1A, 26.1B, 26.1C, 26.2A, 26.2B, 26.2C. and said base body comprising at a second end a cable-contacting arrangement 36, which is connected in an electrical manner by way of at least one cable contact 36.1, 36.2 to a connection cable 3. The sensor-contacting arrangement 38A, 38B, 38C and the cable-contacting arrangement 36 are arranged on a common contact carrier 34A, 34B, 34C. In accordance with the disclosure, the sensor circuit 22A, 22B, 22C is arranged at an end region of the contact carrier 34A, 34B, 34C in such a manner that the sensor circuit 22A, 22B, 22C is oriented in a desired sensing direction RA, RB, RC. The sensing direction RA, RB, RC is predetermined by means of a bend angle αA, αB, αC of the end region of the contact carrier 34A, 34B, 34C with respect to the longitudinal axis LA of the base body 32. The sensor-contacting arrangement 38A, 38B, 38C having the sensor circuit 22A, 22B, 22C is encased by a pot-shaped sheath 24A, 24B, 24C that is fixed to the base body 32 and the shape of said pot-shaped sheath is tailored to suit the sensing direction RA, RB, RC of the sensor circuit 22A, 22B, 22C.

Figure 2:
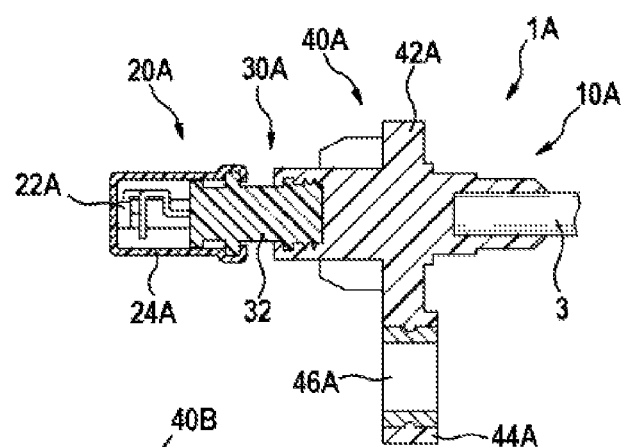
FIG. 2 illustrates a schematic sectional view of the sensor unit in accordance with the disclosure for a vehicle in FIG. 1.
Figure 3:
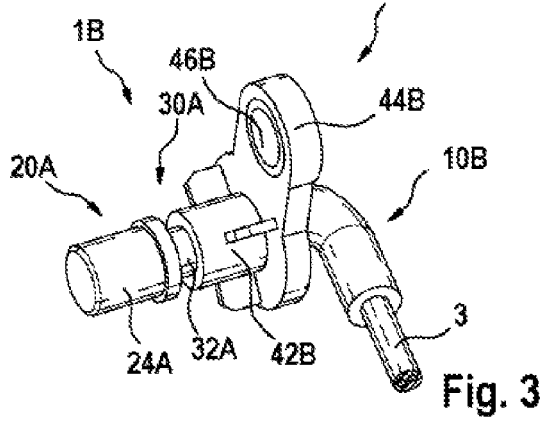
FIG. 3 illustrates a schematic perspective view of a second exemplary embodiment of a sensor unit in accordance with the disclosure for a vehicle.

As is further evident in FIGS. 1 to 3, the illustrated sensor units in accordance with the disclosure 1A, 1B comprise in each case a cable module 10A, 10B, a contact-making module 30A, an attachment module 40A and a sensor module 20A that comprises the sensor circuit 22A, the cable module 30 and of a sheath 24A as a sensor housing. The sensor module 20A, the attachment module 40A and the cable module 10A, 10B can be tailored to suit different customer applications or installation conditions in the vehicle or sensor circuits 22A. The attachment module 40A, 40B can be embodied by way of example as a pre-assembled module whose base body 42A, 42B is pushed on and attached to the base body 32 of the contact-making module 30B prior to the connection cable 3 being electrically connected to the contact-making module 30A, 30B, 30C. As an alternative, the base body 42A, 42B of the attachment module 40A, 40B can be injection molded in one injection molding process onto the base body 32 of the contact-making module 30A, 30B, 30C prior to the connection cable 3 being connected in an electrical manner to the contact-making module 30A, 30B, 30C. As a further alternative, the base body 42A, 42B of the attachment module 40A, 40B can be injection molded in one common injection molding process with the synthetic material sheathing of the cable module 10A, 10B onto the base body 32 of the contact-making module 30A, 30B, 30C.

As is further evident in FIGS. 1 to 3, an end region of the base body 32, which comprises the cable-contacting arrangement 36, and an end region of the connected connection cable 3 are injection molded with a synthetic material sheath so as to form a cable module 10A, 10B. As is further evident in FIGS. 1 and 2, a first cable module 10A guides the connection cable 3 in the case of a first exemplary embodiment of the sensor unit in accordance with the disclosure 1A in an axial manner with respect to the base body 32. As is further evident in FIG. 3, a second cable module 10B guides the connection cable 3 in the case of a second exemplary embodiment of the sensor unit in accordance with the disclosure 1B at a predetermined angle, in this case at an angle of 90°, with respect to the base body. Furthermore, a base body 42A, 42B of the attachment module 40A, 40B is embodied as a synthetic material injection-molded part. Attachment means are arranged on the base body 42A, 42B and in the case of the illustrated exemplary embodiments said attachment means are embodied as attachment brackets 44A, 44B that are formed as one therewith and comprise attachment eyelets 46A, 46B. The attachment eyelet 46A, 46B can be inserted by way of example as an insertion part into the injection molding tool or can be pressed into a corresponding opening in the attachment bracket 44A, 44B after the injection molding process.

Figure 4:
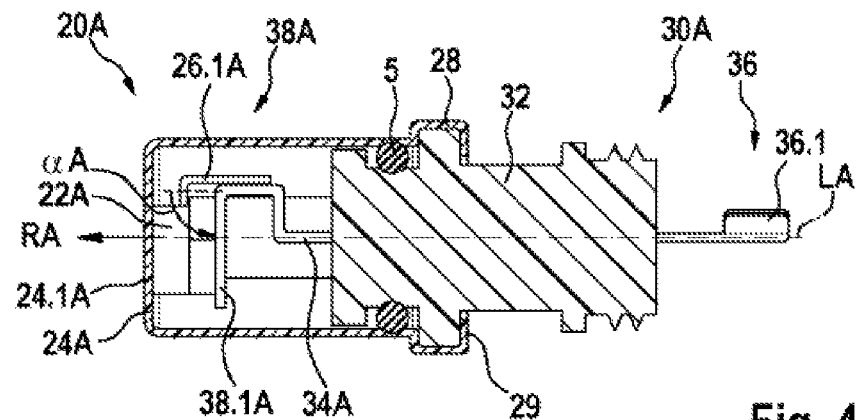
FIG. 4 illustrates a schematic perspective sectional view of a first exemplary embodiment of a pre-assembled module that is embodied as a sensor module and is for the sensor unit in accordance with the disclosure in accordance with FIG. 1 or FIG. 2.

As is further evident in FIG. 4, a first sensing direction RA of a first sensor circuit 22A of a first sensor module 20A extends in an axial manner with respect to the longitudinal axis LA of the base body 32 so that a first bend angle αA of the end region of a first contact carrier 34A has a value in the range between 80° and 90° with respect to the longitudinal axis LA of the base body 32. A first sheath 24A is embodied as a pot cylinder that comprises at its closed end an end face 24.1A and the first sensor circuit 22A abuts with its reading area against said end face 24.1A.

Figure 5:
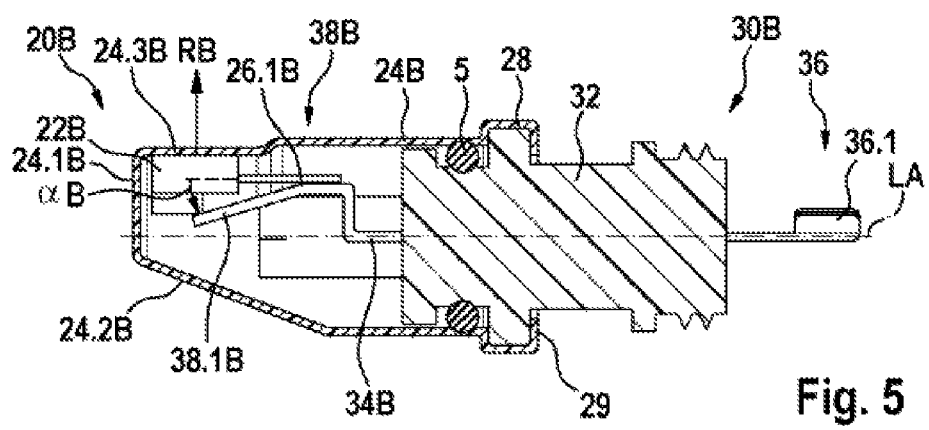
FIG. 5 illustrates a schematic perspective sectional view of a second exemplary embodiment of a pre-assembled module that is embodied as a sensor module and is for the sensor unit in accordance with the disclosure.

As is further evident in FIG. 5, a second sensing direction RB of a second sensor circuit 22B of a second sensor module 20B extends in a perpendicular manner with respect to the longitudinal axis LA of the base body 32 so that a second bend angle αB of the end region of a second contact carrier 34B has a value in the range of 0° to 30° with respect to the longitudinal axis LA of the base body 32. A second sheath 24B is embodied as a pot cylinder having an end face 24.1B, a first inclined surface 24.2B and a flattened area 24.3B, and the second sensor circuit 22B abuts with its reading area against said flattened area 24.3B.

Figure 6:
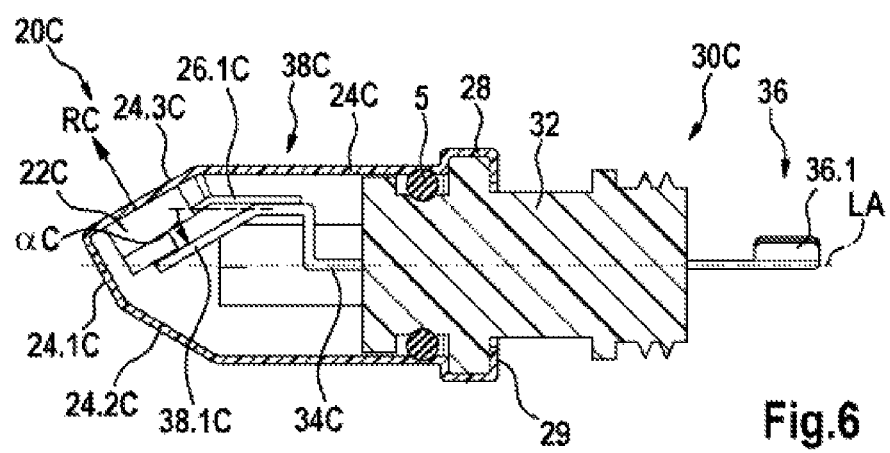
FIG. 6 illustrates a schematic perspective sectional view of a third exemplary embodiment of a pre-assembled module that is embodied as a sensor module and is for the sensor unit in accordance with the disclosure.

As is further evident in FIG. 6, a third sensing direction RC of a third sensor circuit 22C of a third sensor module 20C extends at a predetermined angle in an inclined manner with respect to the longitudinal axis LA of the base body 32 so that a third bend angle αC of the end region of a third contact carrier 34C has a value in the range of 40° to 60° with respect to the longitudinal axis LA of the base body 32. A third sheath 24C is embodied as a pot cylinder having a first inclined surface 24.2C, a second inclined surface 24.1C and a third inclined surface 24.3C and the third sensor circuit 22C abuts with its reading area against said third inclined surface 24.3C.

As is further evident in FIGS. 4 to 6, a widened area having an angled edge 29 is provided in each case at the open end 28 of the respective sheath 24A, 24B, 24C and said widened area abuts against a circumferential annular elevation of the base body 32. A seal 5 that is embodied as an O-ring is arranged in the direction of the sensor-side end of the base body 32 upstream of the annular elevation of the base body 32 and said seal seals the sheath 24A, 24B, 24C with respect to the base body 32.

Figure 7:
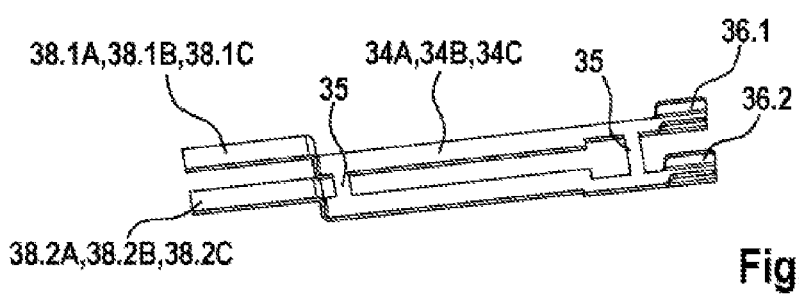
FIG. 7 illustrates a schematic view of an exemplary embodiment of a contact carrier for the sensor module in accordance with FIGS. 1 to 6.

As is further evident in FIG. 7, the contact carrier 34A, 34B, 34C is embodied as a stamped and bent part having the predetermined separation sites 35 by way of which the common contact carrier 34A, 34B, 34C can be divided into individual current paths that in each case connect in an electrical manner a cable contact 36.1, 36.2 of the cable-contacting arrangement 36 to a sensor mating contact 38.1A, 381B, 38.1C. 38.2A, 38.2B, 38.2C of the sensor-contacting arrangement 38A, 38B, 38C.

The electrical cable-contacting arrangement 36 between the connection cable 3 and the at least one cable contact 36.1, 36.2 is embodied by way of example as a mechanical connection, preferably as a crimp connection and/or an insulation displacement connection. In the case of the illustrated exemplary embodiments, the cable contacts 36.1, 36.2 are embodied as crimp pockets and an end, which is stripped of insulation, of an individual line of the connection cable 3 is inserted in each case into a crimp pocket.

Figure 8:
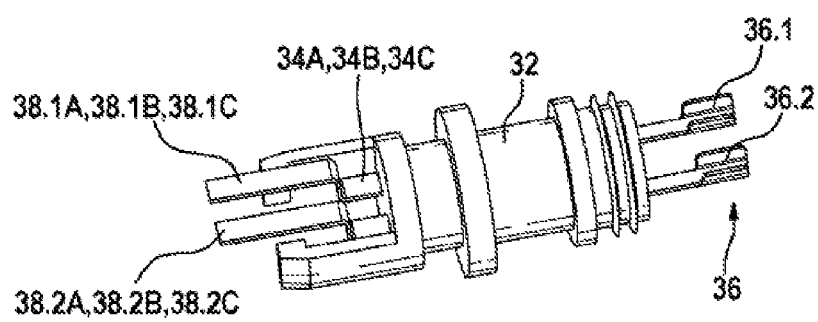
FIG. 8 illustrates a schematic perspective view of an intermediate product during the production of a contact-making module for the sensor module in accordance with FIGS. 1 to 6.

As is further evident in FIG. 8, the base body 32 is embodied as a synthetic material injection-molded part that encases the contact carrier 34A, 34B, 34C at least in part. After the injection molding process so as to form the base body 32 of the contact-making module 30A, 30B, 30C, the at least one separation site 35 between the current paths is separated. The base body 32 and the contact carrier 34A, 34B, 34C can be embodied as a pre-assembled module that can be tailored to suit different customer applications or installation conditions in the vehicle or different sensor circuits 22A, 22B, 22C.

Figure 9:
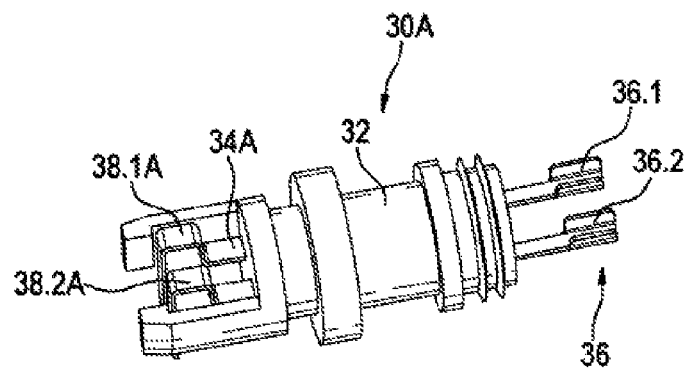
FIG. 9 illustrates a schematic perspective view of a first exemplary embodiment of a pre-assembled module that is embodied as a contact-making module and is for the sensor unit in accordance with FIG. 4.
Figure 10:
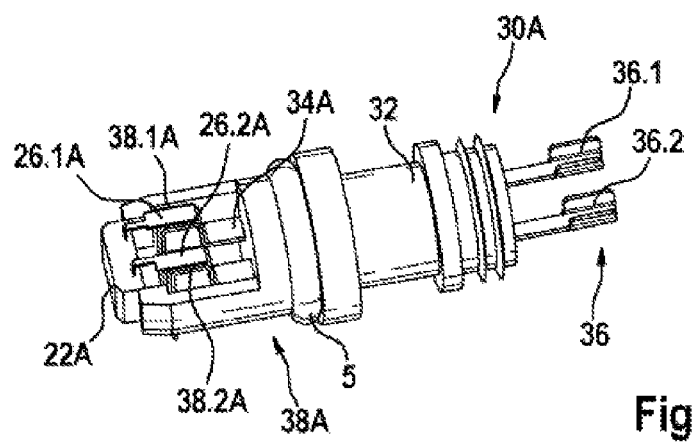
FIG. 10 illustrates a schematic perspective view of an intermediate product during the production of the first sensor module in accordance with FIG. 4.
Figure 11:
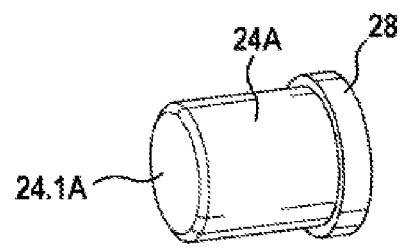
FIG. 11 illustrates a schematic perspective view of a sheath for the first sensor module in accordance with FIG. 4

As is further evident in FIGS. 9 and 10, so as to produce the first sensor module 20A, the two sensor mating contacts 38.1A, 38.2A of the first sensor-contacting arrangement 38A are bent at the end region of the first contact carrier 34A in the illustrated example about a first bend angle αA of approx. 90° with respect to the longitudinal axis LA of the base body 32. Subsequently, the first sensor circuit 22A is connected in an electrical and mechanical manner by way of the two sensor contacts 26.1A, 26.2A to the two corresponding sensor mating contacts 38.1A, 38.2A of the sensor-contacting arrangement 38A of the first contact carrier 34A. The two sensor contacts 26.1A, 26.2A of the first sensor circuit 22A are connected in an electrical and mechanical manner by way of example by means of soldering and/or riveting and/or welding to the corresponding sensor mating contacts 38.1A, 38.2A. The two sensor contacts 26.1A, 26.2A can be tailored by means of bending to suit the corresponding sensor mating contacts 38.1A, 38.2A prior to making the connection. In the illustrated exemplary embodiment, the two sensor contacts 26.1A, 26.2A have in each case an angle of approx. 90° with respect to the sensor circuit 22A. The base body 32 and the first contact carrier 34A can form, with or without a first sensor circuit 22A that is not programmed, a contact-making module 30A that is embodied as a pre-assembled module and can be tailored to suit different customer applications or installation conditions in the vehicle. After contact has been made with the first sensor circuit 22A, the first sheath 24A that is illustrated in FIG. 11 and is embodied as a pot cylinder can be pushed onto the sensor-side end of the base body 32 and can be connected thereto in a fluid-tight manner. The first sheath 24A is pushed on in such a manner that the first sensor circuit 22A abuts with its reading area against the end face 24.1A.

Figure 12:
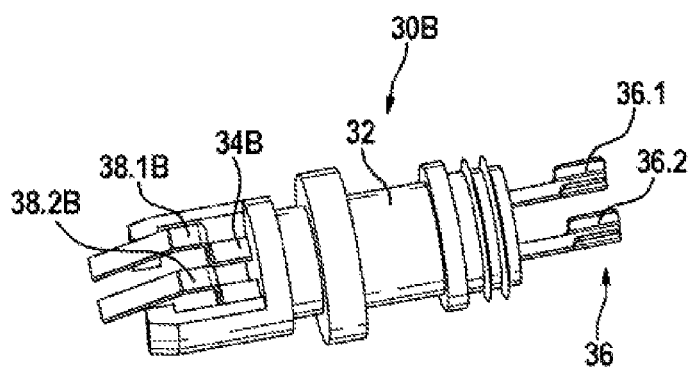
FIG. 12 illustrates a schematic perspective view of a second exemplary embodiment of a pre-assembled module that is embodied as a contact-making module for a second sensor module in accordance with FIG. 5.
Figure 13:
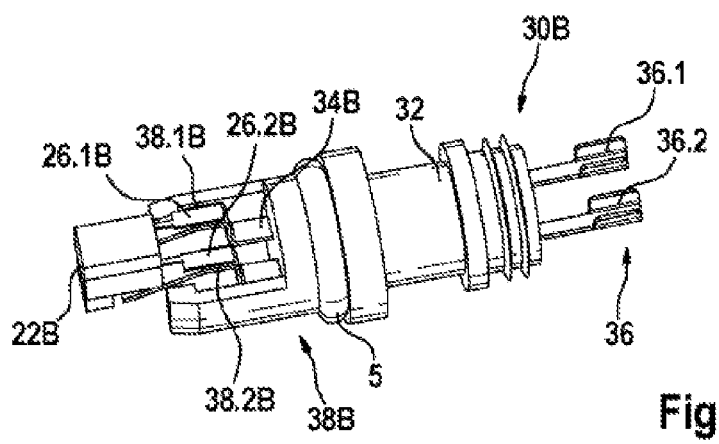
FIG. 13 illustrates a schematic perspective view of an intermediate product during the production of the second sensor module in accordance with FIG. 5.
Figure 14:
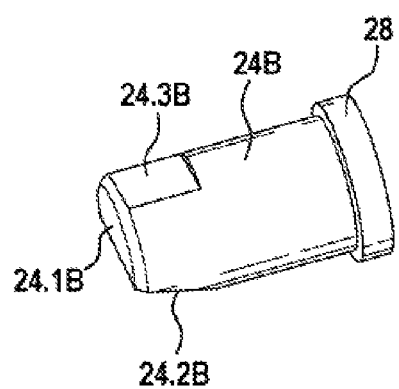
FIG. 14 illustrates a schematic perspective view of a sheath for the second sensor module in accordance with FIG. 5.

As is further evident in FIGS. 12 and 13, so as to produce the second sensor module 20B, the two sensor mating contacts 38.1B, 38.2B of the sensor-contacting arrangement 38B are bent at the end region of the second contact carrier 34B in the illustrated example about a second bend angle αB of approx. 30° with respect to the longitudinal axis LA of the base body 32. Subsequently, the second sensor circuit 22B is connected in an electrical and mechanical manner by way of the two sensor contacts 26.1B, 26.2B to the two corresponding sensor mating contacts 38.1B, 38.2B of the sensor-contacting arrangement 38B of the second contact carrier 34B. The two sensor contacts 26.1B, 26.2B of the second sensor circuit 22B are connected in an electrical and mechanical manner by way of example by means of soldering and/or riveting and/or welding to the corresponding sensor mating contacts 38.1B, 38.2B. In the illustrated exemplary embodiment, the two sensor contacts 26.1B, 26.2B are placed without the bending process onto the corresponding sensor mating contacts 38.1B, 38.2B and comprise in each case an angle of approx. 0° with respect to the second sensor circuit 22B. The base body 32 and the second contact carrier 34B can form, with or without a second sensor circuit 22B that is not programmed, a contact-making module 30B that is embodied as a pre-assembled module and can be tailored to suit different customer applications or installation conditions in the vehicle. After contact has been made with the second sensor circuit 22B, the second sheath 24B that is illustrated in FIG. 14 and is embodied as a pot cylinder having an end face 24.1B, a first inclined surface 24.2B and a flattened area 24.3B is pushed onto the sensor-side end of the base body 32 and connected thereto in a fluid-tight manner. The second sheath 24B is pushed on in such a manner that the second sensor circuit 22B abuts with its reading area against the flattened area 24.3B.

Figure 15:
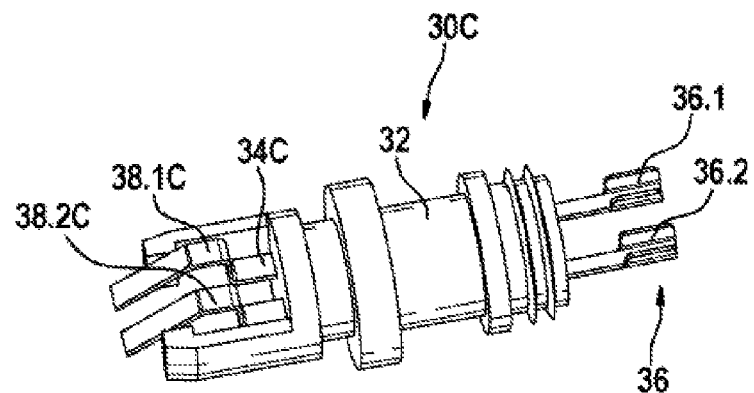
FIG. 15 illustrates a schematic perspective view of a third exemplary embodiment of a pre-assembled module that is embodied as a contact-making module and is for a third sensor module in accordance with FIG. 6.
Figure 16:
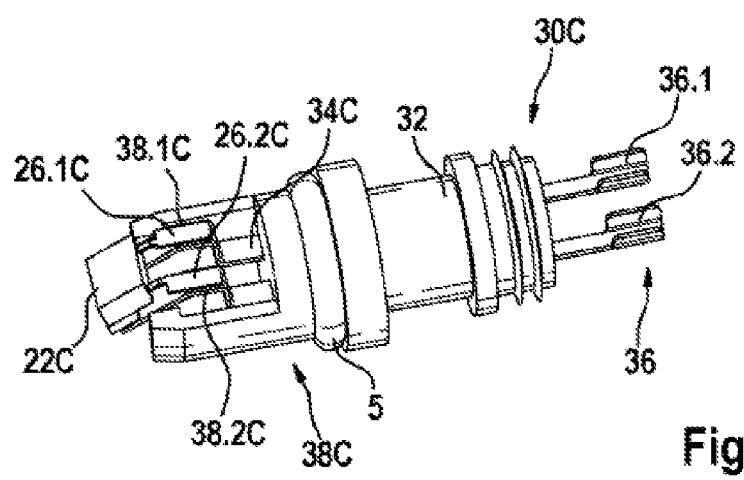
FIG. 16 illustrates a schematic perspective view of an intermediate product during the production of the third sensor module in accordance with FIG. 6.
Figure 17:
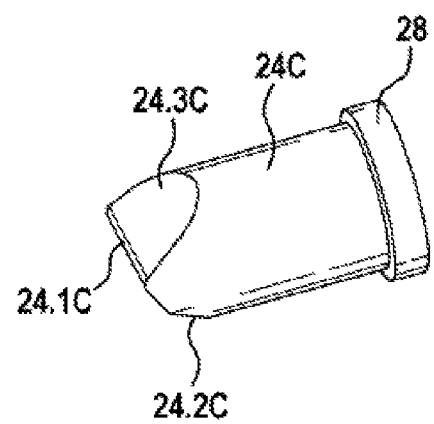
FIG. 17 illustrates a schematic perspective view of a sheath for the third sensor module in accordance with FIG. 6.

As is further evident in FIGS. 15 and 16, so as to produce the third sensor module 20C, the two sensor mating contacts 38.1C, 38.2C of the sensor-contacting arrangement 38C are bent at the end region of the third contact carrier 34C in the illustrated example about a third bend angle αC of approx. 45° with respect to the longitudinal axis LA of the base body 32. Subsequently, the third sensor circuit 22C is connected in an electrical and mechanical manner by way of the two sensor contacts 26.1C, 26.2C to the two corresponding sensor mating contacts 38.1C, 38.2C of the sensor-contacting arrangement 38C of the third contact carrier 34C. The two sensor contacts 26.1C, 26.2C of the third sensor circuit 22C are connected by way of example by means of soldering and/or riveting and/or welding to the corresponding sensor mating contacts 38.1C, 38.2C. The two sensor contacts 26.1C, 26.2C can be tailored by means of bending to suit the corresponding sensor mating contacts 38.1C, 38.2C prior to being connected. In the illustrated exemplary embodiment, the two sensor contacts 26.1C, 26.2C have in each case an angle of approx. 30° with respect to the third sensor circuit 22C. The base body 32 and the third contact carrier 34C can form, with or without the third sensor circuit 22C that is not programmed, a contact-making module 30C that is embodied as a pre-assembled module and can be tailored to suit different customer applications or installation conditions in the vehicle. After contact has been made with the third sensor circuit 22C, the third sheath 24C that is illustrated in FIG. 17 and is embodied as a pot cylinder having a first inclined surface 24.2C, a second inclined surface 24.1C and a third inclined surface 24.3C is pushed on to the sensor-side end of the base body 32 and is connected thereto in a fluid-tight manner. The third sheath 24C is pushed on so that the third sensor circuit 22C abuts with its reading area against the third inclined surface 24.3C.

The connection sites between the modules 10A, 10B, 20A, 20B, 20C, 30A, 30B, 30C, 40A, 40B are embodied in such a manner that a mechanical pre-fixing procedure and a final connection procedure can be implemented using a laser. The length of the sensor unit 1A, 1B can be varied by virtue of contact-making modules 30A, 30B, 30C having different lengths without influencing the connection sites, in other words the sensor-contacting arrangement 38A, 38B, 38C and/or the cable-contacting arrangement 36.

The invention claimed is:

1. A sensor unit for a vehicle, comprising:
   a connection cable;
   a sensor circuit that includes at least one sensor contact;
   a base body that supports the sensor circuit and that includes:
   a common contact carrier;
   a sensor-contacting arrangement that is disposed on the common contact carrier at a first end of the base body, and that has at least one sensor mating contact connected in an electrical manner to the at least one sensor contact; and
   a cable-contacting arrangement that is disposed on the common contact carrier at a second end of the base body, and that includes at least one cable contact connected in an electrical manner to the connection cable;
   wherein the sensor circuit is arranged at an end region of the common contact carrier such that the sensor circuit is oriented in a desired sensing direction; and wherein the sensing direction is predetermined via a bend angle of the end region of the common contact carrier with respect to a longitudinal axis of the base body; and a pot-shaped sheath that (i) encases the sensor contacting arrangement and the sensor circuit and (ii) surrounds a protrusion on the base body so as to form a mechanical interlock that fixes the pot-shaped sheath to the base body and closes the sensor unit, the shape of said pot-shaped sheath configured based on the sensing direction of the sensor circuit.

2. The sensor unit as claimed in claim 1, wherein:
the sensing direction extends in an axial manner with respect to the longitudinal axis of the base body so that the bend angle of the end region of the common contact carrier has a value in the range between 80° and 90° with respect to the longitudinal axis of the base body;
the pot-shaped sheath is embodied as a pot cylinder; and
a reading area of the sensor circuit abuts against an end face of the pot-shaped sheath.

3. The sensor unit as claimed in claim 1, wherein:
the sensing direction of the sensor circuit extends in a perpendicular manner with respect to the longitudinal axis of the base body so that the bend angle of the end region of the common contact carrier has a value in the range of 0° to 30° with respect to the longitudinal axis of the base body;
the pot-shaped sheath is embodied as a pot cylinder having an end face, a first inclined surface and a flattened area; and
a reading area of the sensor circuit abuts against said flattened area.

4. The sensor unit as claimed in claim 1, wherein:
the sensing direction of the sensor circuit extends at a predetermined angle in an inclined manner with respect to the longitudinal axis of the base body so that the bend angle of the end region of the common contact carrier has a value in the range of 40° to 60° with respect to the longitudinal axis of the base body;
the pot-shaped sheath is embodied as a pot cylinder having a first inclined surface, a second inclined surface that adjoins the first inclined surface, and a third inclined surface that adjoins the second inclined surface; and
a reading area of the sensor circuit abuts against the third inclined surface.

5. The sensor unit as claimed in claim 1, further comprising:
a seal that seals the sheath with respect to the base body.

6. The sensor unit as claimed in claim 1, wherein:
the base body and the common contact carrier form a contact-making module; and
the base body is embodied as a synthetic material injection-molded part that encases the contact carrier at least in part.

7. The sensor unit as claimed in claim 6, wherein the base body that is formed as a synthetic material injection-molded part does not encase the contact carrier at least one of (i) at least at the cable-contacting arrangement and (ii) at least at the sensor-contacting arrangement.

8. The sensor unit as claimed in claim 1, wherein the cable-contacting arrangement between the connection cable and the at least one cable contact includes a mechanical connection.

9. The sensor unit as claimed in claim 8, wherein an end region of the base body with the cable-contacting arrangement, and an end region of the connection cable are injection molded in a fluid-tight manner and form a cable module.

10. The sensor unit as claimed in claim 9, wherein the cable module guides the connection cable in an axial manner or at a predetermined angle with respect to the base body.

11. The sensor unit as claimed in claim 1, further comprising:
an attachment module that includes a second base body, wherein the second base body is embodied as a synthetic material injection-molded part that is injection molded or pushed on at the cable-side end of the base body.

12. The sensor unit as claimed in claim 11, wherein the attachment module further includes:
an attachment bracket that is integral with the second base body and defines an attachment eyelet.

13. The sensor unit as claimed in claim 11, wherein:
an end region of the base body with the cable-contacting arrangement, and an end region of the connection cable are injection molded in a fluid-tight manner and form a cable module; and
the cable module is integrated into the attachment module.

14. A method for producing a sensor unit for a vehicle, said sensor unit having a base body with a common contact carrier, the method comprising:
arranging a sensor-contacting arrangement on the common contact carrier at a first end of the base body;
arranging a cable-contacting arrangement on the common contact carrier at a second end of the base body;
arranging a sensor circuit that includes at least one sensor contact at an end region of the common contact carrier;
bending the end region of the common contact carrier about a bend angle with respect to the longitudinal axis of the base body to orient the sensor circuit in a sensing direction;
connecting the sensor-contacting arrangement to the at least one sensor contact in an electrical manner via at least one sensor mating contact;
connecting the cable-contacting arrangement to a connection cable in an electrical manner via at least one cable contact;
providing a sheath having a shape adapted for the sensing direction of the sensor circuit; and
fixing the sheath to the base body so as to encase the sensor-contacting arrangement and the sensor circuit, the sheath fixed to the base body by forming a mechanical interlock between a protrusion on the base body and an end region of the sheath that surrounds the protrusion.

15. The method as claimed in claim 14, wherein:
the bend angle for the end region of the contact carrier is based on the sensing direction of the sensor circuit; and
the shape of the sheath is selected based on the sensing direction of the sensor circuit.

16. The method as claimed in claim 14, further comprising:
forming the base body by injection molding a synthetic material around the contact carrier, the forming including defining a recess in the base body at least one of at least at the cable-contacting arrangement and at least at the sensor-contacting arrangement.

17. The method as claimed in claim 14, wherein the base body having the sensor circuit and the sheath form a pre-assembled sensor module, the method further comprising connecting the pre-assembled sensor module to at least one of a cable module and an attachment module.

18. The method as claimed in claim 14, further comprising:
   forming a mechanical connection using the cable-contacting arrangement between the connection cable and the at least one cable-contacting arrangement.

19. The method as claimed in claim 18, further comprising:
   injection molding an end region of the base body, which comprises the cable-contacting arrangement, and an end region of the connection cable in a fluid-tight manner so as to form a cable module.

20. The method as claimed in claim 14, further comprising:
   forming an attachment module that includes a second base body and an attachment bracket integral with the second base body, and that defines an attachment eyelet via injection molding with a synthetic material; and
   attaching the attachment module to a cable-side end of the base body via either injection molding the attachment module onto the base body, or via pushing the attachment module onto the base body.

* * * * *